US009628112B2

(12) United States Patent
Bao

(10) Patent No.: US 9,628,112 B2
(45) Date of Patent: Apr. 18, 2017

(54) APPARATUS AND METHOD FOR LENGTH AND RATE VARIABLE LDPC ENCODER AND DECODER USING SHORTENING SET ALLOCATOR

(71) Applicant: Xingkai Bao, Glenview, IL (US)

(72) Inventor: Xingkai Bao, Glenview, IL (US)

(73) Assignee: Zenith Electronics, LLC, Lincolnshire, IL (US)

( * ) Notice: Subject to any disclaimer, the term of this patent is extended or adjusted under 35 U.S.C. 154(b) by 0 days.

(21) Appl. No.: 15/153,086

(22) Filed: May 12, 2016

(65) Prior Publication Data
US 2016/0261287 A1    Sep. 8, 2016

Related U.S. Application Data

(62) Division of application No. 14/551,669, filed on Nov. 24, 2014.

(51) Int. Cl.
| H03M 13/00 | (2006.01) |
| G06F 11/00 | (2006.01) |
| H03M 13/25 | (2006.01) |
| H03M 13/11 | (2006.01) |

(52) U.S. Cl.
CPC ....... *H03M 13/255* (2013.01); *H03M 13/005* (2013.01); *H03M 13/1105* (2013.01); *H03M 13/116* (2013.01); *H03M 13/1174* (2013.01); *H03M 13/1177* (2013.01); *H03M 13/616* (2013.01); *H03M 13/618* (2013.01); *H03M 13/6393* (2013.01)

(58) Field of Classification Search
CPC ......... H03M 13/6393; H03M 13/6368; H03M 13/1111; H03M 13/616; H03M 13/255; H03M 13/1177
See application file for complete search history.

(56) References Cited

U.S. PATENT DOCUMENTS

| 8,225,173 B2* | 7/2012 | Shasha | H03M 13/033 |
| | | | 714/746 |
| 8,527,830 B2* | 9/2013 | Xu | H03M 13/116 |
| | | | 714/752 |
| 2009/0259915 A1* | 10/2009 | Livshitz | H03M 13/1111 |
| | | | 714/758 |

OTHER PUBLICATIONS

Ha et al., Rate compatible punctured Low density parity check codes with short block lengths, 2006, IEEETrans. on Info. Theory, vol. 52, No. 2, pp. 728-738.*

* cited by examiner

*Primary Examiner* — Shelly A Chase
(74) *Attorney, Agent, or Firm* — Schiff Hardin LLP

(57) ABSTRACT

A method and apparatus for encoding data and for decoding data using LDPC (low density parity check) codes includes providing a mother LDPC matrix of a particular size. A data payload of a smaller size is encoded by shortening the mother matrix to a smaller daughter matrix corresponding in size to the data payload and using the smaller daughter matrix for the encoding. The portions of the mother matrix to be removed in the shortening are derived from a control signal. The encoded data is transmitted with the control signal so that the receiver can derive the portions of the mother matrix to be removed to obtain the daughter matrix. At the receiver, a mother matrix is shortened to a daughter matrix and is then used to decode the data. The data at the encoder may be further reduced by puncturing to remove selected information bits and selected parity bits. The decoder inserts the selected information bits and parity bits when decoding the data.

20 Claims, 8 Drawing Sheets

Figure 3a — Mother Quasi-cyclic LDPC code H matrix (80a)

Information Bits

| 1 | 2 | 3 | 4 | 5 | 6 | 7 | 8 | 9 | 10 | 11 | 12 | 13 | 14 | 15 | 16 | 17 | 18 | 19 | 20 | 21 |
|---|---|---|---|---|---|---|---|---|----|----|----|----|----|----|----|----|----|----|----|----|
| 316 | S | S |   |   |   | S |   |   |   |   |   |   |   | S |   |   |   |   |   | S |
| 134 |   | 155 |   | 76 | 283 |   |   |   |   | 138 |   |   |   | 333 | 55 |   |   |   |   | 52 |
| 0 | 75 | 211 | 321 | 165 |   |   |   |   |   |   |   | 123 | 183 |   |   |   | 208 |   |   | 105 |
| 321 |   |   |   | 57 | 327 | 225 | 63 |   |   |   | 267 |   |   |   |   |   |   |   |   |   |
| 121 | 159 | 336 | 318 |   | 262 | 86 |   |   |   | 121 | 8 |   |   |   |   |   |   |   |   |   |
| 141 |   | 273 |   | 151 | 133 |   |   |   |   |   |   | 29 |   |   |   | 169 |   |   |   |   |
| 177 | 310 |   | 245 | 350 | 89 |   |   |   |   |   |   |   |   | 129 |   |   |   |   | 292 |   |
| 33 | 176 |   | 257 | 310 |   |   |   |   |   |   |   |   |   | 259 | 120 |   |   | 357 |   | 285 |
| 110 | 101 |   | 313 | 198 | 254 |   | 271 | 279 |   |   |   |   | 328 |   |   | 294 | 172 |   | 181 |   |
| 244 | 19 |   |   |   |   |   |   | 32 | 352 | 110 | 152 | 187 |   |   |   |   |   |   |   |   |
| 350 | 85 |   | 268 | 140 | 292 |   | 97 |   | 348 |   |   |   |   |   |   |   |   |   |   |   |
| 210 | 243 | 239 |   | 336 |   |   |   |   |   |   |   |   |   |   |   | 6 |   | 10 |   |   |
| 293 |   | 309 | 9 |   | 338 | 107 |   |   |   |   |   |   | 231 |   | 346 |   | 19 | 43 |   |   |
| 284 | 314 | 64 |   | 247 | 184 |   |   | 0 | 188 |   |   |   |   |   |   |   |   |   | 134 |   |
| 268 |   |   | 192 | 215 |   |   |   |   |   |   |   |   |   |   |   |   |   |   |   |   |
| 39 |   | 161 |   |   |   |   |   |   |   |   |   |   |   |   |   |   |   |   |   |   |
| 239 |   | 283 | 224 |   |   |   |   |   |   |   |   |   |   |   |   |   |   |   |   |   |
| 241 | 230 |   |   |   |   |   |   |   |   |   |   |   |   |   |   |   |   |   |   |   |
| 326 | 222 | 116 |   |   | 353 |   |   |   |   |   |   |   |   |   |   |   |   |   |   |   |

Figure 3a — Mother Quasi-cyclic LDPC code H matrix

| Information Bits (cont.) | | | | | | Parity Bits | | | | | | | | | | | | | | | | | | |
|---|---|---|---|---|---|---|---|---|---|---|---|---|---|---|---|---|---|---|---|---|---|---|---|---|
| 22 | 23 | 24 | 25 | 26 | 27 | 1 | 2 | 3 | 4 | 5 | 6 | 7 | 8 | 9 | 10 | 11 | 12 | 13 | 14 | 15 | 16 | 17 | 18 | 19 |
|  |  |  |  |  | S |  |  |  |  |  |  |  |  |  |  |  |  |  |  |  |  |  |  |  |
|  |  |  |  |  | 1 | 0 |  |  |  |  |  |  |  |  |  |  |  |  |  |  |  |  |  | 1 |
|  |  |  |  |  | 3 | 0 | 0 |  |  |  |  |  |  |  |  |  |  |  |  |  |  |  |  |  |
|  |  | 176 |  |  |  |  | 0 | 0 |  |  |  |  |  |  |  |  |  |  |  |  |  |  |  |  |
|  |  | 353 |  | 225 |  |  |  | 0 | 0 |  |  |  |  |  |  |  |  |  |  |  |  |  |  |  |
|  |  |  |  |  | 63 |  |  |  | 0 | 0 |  |  |  |  |  |  |  |  |  |  |  |  |  |  |
|  | 157 |  |  |  |  |  |  |  |  | 0 | 0 |  |  |  |  |  |  |  |  |  |  |  |  |  |
|  |  |  |  | 347 |  |  |  |  |  |  | 0 | 0 |  |  |  |  |  |  |  |  |  |  |  |  |
|  |  | 206 | 283 |  |  |  |  |  |  |  |  | 0 | 0 |  |  |  |  |  |  |  |  |  |  |  |
|  |  |  |  |  |  |  |  |  |  |  |  |  | 0 | 0 |  |  |  |  |  |  |  |  |  |  |
|  | 325 |  |  |  |  |  |  |  |  |  |  |  |  | 0 | 0 |  |  |  |  |  |  |  |  |  |
|  |  |  | 128 |  |  |  |  |  |  |  |  |  |  |  | 0 | 0 |  |  |  |  |  |  |  |  |
| 288 |  |  |  |  |  |  |  |  |  |  |  |  |  |  |  | 0 | 0 |  |  |  |  |  |  |  |
|  | 100 |  |  |  |  |  |  |  |  |  |  |  |  |  |  |  | 0 | 0 |  |  |  |  |  |  |
| 331 |  |  | 41 |  |  |  |  |  |  |  |  |  |  |  |  |  |  | 0 | 0 |  |  |  |  |  |
|  |  |  |  | 242 |  |  |  |  |  |  |  |  |  |  |  |  |  |  | 0 | 0 |  |  |  |  |
|  |  |  |  |  |  |  |  |  |  |  |  |  |  |  |  |  |  |  |  | 0 | 0 |  |  |  |
|  |  |  |  |  |  |  |  |  |  |  |  |  |  |  |  |  |  |  |  |  | 0 | 0 |  |  |
|  |  |  |  |  |  |  |  |  |  |  |  |  |  |  |  |  |  |  |  |  |  | 0 | 0 |  |
|  |  |  |  |  |  |  |  |  |  |  |  |  |  |  |  |  |  |  |  |  |  |  | 0 | 0 |

80b

84

Mother Quasi-cyclic LDPC code H matrix

*Figure 3b*

Mother Quasi-cyclic LDPC code H matrix

*Figure 4a*

Information Bits

| 1 | 2 | 3 | 4 | 5 | 6 | 7 | 8 | 9 | 10 | 11 | 12 | 13 | 14 | 15 | 16 | 17 | 18 | 19 | 20 | 21 |
|---|---|---|---|---|---|---|---|---|---|---|---|---|---|---|---|---|---|---|---|---|
| P | | | P | P | | | | | | | | | | | | | | | | |
| 316 | | 155 | | 76 | | | | | | | | | | 333 | 55 | | | | | 52 |
| 134 | | 211 | | 165 | 283 | | | | | 138 | | | | | | | | | | 105 |
| 0 | 75 | | 321 | | | | | | | | | 123 | 183 | | | | 208 | | | |
| 321 | | 336 | | 57 | 327 | 225 | | | | | 267 | | | | | | | | | |
| 121 | 159 | | 318 | | 262 | 86 | 63 | | | 121 | 8 | | | | | | | | | |
| 141 | | 273 | | 151 | | | | | | | | 29 | | | | 169 | | 357 | 292 | |
| 177 | 310 | | 245 | 350 | 133 | | | | | | | | | 129 | | | | | 181 | |
| 33 | 176 | | 257 | 310 | 89 | | | | | | | | | 259 | | 294 | 172 | | | 285 |
| 110 | 101 | | 313 | 198 | | | | | | | | | 328 | | | | | | | |
| 244 | 19 | | | | 254 | | | | | 110 | | | | | | | | | | |
| 350 | 85 | | 268 | | | | 271 | 279 | | | | | | | | | | | | |
| 210 | 243 | 239 | | 140 | 292 | | 97 | 32 | 352 | | 152 | | 328 | | | | | | | |
| 293 | 309 | | 9 | 336 | | | | | 348 | | | | | | 120 | | | | | |
| 284 | 64 | | | | | | | | | | | 187 | | | | | | | | |
| 268 | 314 | | 192 | 247 | 338 | | | | | | | | 231 | | | | | | | |
| 39 | | 161 | 215 | | | 107 | | | | | | | | | | 6 | | 10 | | |
| 239 | | 283 | 224 | | 184 | | | | | | | | | | 346 | | 19 | 43 | | |
| 241 | 230 | | | | | | | 0 | | | | | | | | | | | | |
| 326 | 222 | 116 | | | 353 | | | | 188 | | | | | | | | | | 134 | |

88 ← | → 80a | 82 ↗

Figure 4b — Mother Quasi-cyclic LDPC code H matrix (80b, 84)

| | Information Bits (cont.) | | | | | | Parity Bits | | | | | | | | | | | | | | | | | |
|---|---|---|---|---|---|---|---|---|---|---|---|---|---|---|---|---|---|---|---|---|---|---|---|---|
| | 22 | 23 | 24 | 25 | 26 | 27 | 1 | 2 | 3 | 4 | 5 | 6 | 7 | 8 | 9 | 10 | 11 | 12 | 13 | 14 | 15 | 16 | 17 | 18 | 19 |
| | | | 176 | | | 1 | 0 | | | | | | | | | | | | | | | | | | 1 |
| | | | 353 | | | 3 | 0 | 0 | | | | | | | | | | | | | | | | | |
| | | | | | 225 | | | 0 | 0 | | | | | | | | | | | | | | | | |
| | | | | | | 63 | | | 0 | 0 | | | | | | | | | | | | | | | |
| | | 157 | | | | | | | | 0 | 0 | | | | | | | | | | | | | | |
| | | | | | 347 | | | | | | 0 | 0 | | | | | | | | | | | | | |
| | | | 206 | 283 | | | | | | | | 0 | 0 | | | | | | | | | | | | |
| | 95 | | | | | | | | | | | | | 0 | 0 | | | | | | | | | | |
| | | 325 | | | | | | | | | | | | | 0 | 0 | | | | | | | | | |
| | 288 | 100 | | 128 | | | | | | | | | | | | | 0 | 0 | | | | | | | |
| | | | | | | | | | | | | | | | | | | 0 | 0 | | | | | | |
| | | | | | | | | | | | | | | | | | | | 0 | 0 | | | | | |
| | 331 | | | 41 | | | | | | | | | | | | | | | | 0 | 0 | | | | |
| | | | | | | | | | | | | | | | | | | | | | 0 | 0 | | | |
| | | | | | 242 | | | | | | | | | | | | | | | | | 0 | 0 | | |
| | | | | | | | | | | | | | | | | | | | | | | | 0 | 0 | |
| | | | | | | | | | | | | | | | | | | | | | | | | 0 | 0 |
| | | | | | | | 0 | | | | | | | | | | | | | | | | | | 0 |

Information Bits

| 1 | 2 | 3 | 4 | 5 | 6 | 7 | 8 | 9 | 10 | 11 | 12 | 13 | 14 | 15 | 16 | 17 | 18 | 19 | 20 | 21 |
|---|---|---|---|---|---|---|---|---|---|---|---|---|---|---|---|---|---|---|---|---|
| 316 |  | 155 |  |  |  |  |  |  |  |  |  |  |  |  |  |  |  |  |  |  |
| 134 |  | 211 |  | 76 | 165 | 283 |  |  |  |  |  |  |  | 333 | 55 |  |  |  |  | 52 |
| 0 | 75 |  | 321 |  |  |  |  |  |  | 138 |  | 123 | 183 |  |  |  | 208 |  |  | 105 |
| 321 |  | 336 |  | 57 | 327 | 225 |  |  |  |  | 267 |  |  |  |  |  |  |  |  |  |
| 121 | 159 |  | 318 |  |  | 86 | 63 |  |  | 121 | 8 |  |  |  |  |  |  |  |  |  |
| 141 |  | 273 |  | 151 | 262 |  |  |  |  |  |  |  |  |  |  | 169 |  |  | 292 |  |
| 177 | 310 |  |  | 350 | 133 |  |  |  |  |  |  | 29 |  | 129 |  |  |  | 357 | 181 |  |
| 33 | 176 |  | 245 | 310 | 89 |  |  |  |  |  |  |  |  | 259 |  | 294 |  |  |  |  |
| 110 | 101 |  | 257 | 198 |  |  |  |  |  |  |  |  | 328 |  | 120 |  | 172 |  |  |  |
| 244 | 19 |  | 313 |  | 254 |  | 271 | 279 |  | 110 |  | 187 |  |  |  |  |  |  |  |  |
| 350 | 85 |  | 268 |  |  |  | 97 | 32 | 352 |  | 152 |  |  |  |  |  |  |  |  |  |
| 210 | 243 | 239 |  | 140 | 292 |  |  |  | 348 |  |  |  | 231 |  |  | 6 |  | 10 |  |  |
| 293 |  | 309 | 9 | 336 |  |  |  |  |  |  |  |  |  |  | 346 |  |  | 43 |  | 285 |
| 284 |  | 64 |  |  |  | 107 |  |  |  |  |  |  |  |  |  |  | 19 |  |  |  |
| 268 | 314 |  | 192 | 247 | 338 |  |  |  |  |  |  |  |  |  |  |  |  |  |  |  |
| 39 |  | 161 | 215 |  | 184 |  |  | 0 |  |  |  |  |  |  |  |  |  |  |  |  |
| 239 |  | 283 | 224 |  |  |  |  |  |  |  |  |  |  |  |  |  |  |  |  |  |
| 241 | 230 |  |  |  | 353 |  |  |  | 188 |  |  |  |  |  |  |  |  |  | 134 |  |
| 326 | 222 | 116 |  |  |  |  |  |  |  |  |  |  |  |  |  |  |  |  |  |  |

Mother Quasi-cyclic LDPC code H matrix

Mother Quasi-cyclic LDPC code H matrix

APPARATUS AND METHOD FOR LENGTH AND RATE VARIABLE LDPC ENCODER AND DECODER USING SHORTENING SET ALLOCATOR

CROSS-REFERENCE TO RELATED APPLICATION

The present application is a divisional patent application of co-pending application Ser. No. 14/551,669, filed Nov. 24, 2014, which is incorporated herein by reference.

BACKGROUND

Field

The present method and system relates generally to a digital communication system and more particularly to the use of error correcting codes in digital communications systems, and particularly relates to the use of LDPC (low density parity check) codes in digital communications systems. Examples of such systems include digital television broadcast systems, cellular telephone systems and the like.

Description of the Related Art

Like all linear block codes, an LDPC (low density parity check) code can be described in terms of a matrix. In the case of an LDPC code the matrix contains a first portion consisting of information bits and a second portion containing parity bits, the matrix commonly being referred to as an H-matrix, or a parity check matrix. The LDPC code gets its name from the H-matrix which contains relatively few 1's in comparison to the number of 0's.

Many modern communications systems require the use of error correction codes that can accommodate different code rates and different lengths of information bits. It is well known that longer code lengths improve error correcting performance, while shorter code lengths are characterized by reduced processing delays. Likewise it is known that increasing code rates improves the data rate and bandwidth efficiency, while reducing code rates increases information robustness in noisy channels. However, designing separate error correction codes for each different code length and code rate that may be used in a particular communications system is a very complicated process and often not practical.

It would therefore be highly desirable to provide a novel error correction system using error correction codes capable of adapting to different information lengths and different code rates. Such a system would be designed with the goal of providing performance that is equal or close to the performance of systems using separately designed codes and would inherently be of low complexity since it would obviate the need to design a separate code for each condition and would employ encoder and decoder hardware that can be reused in different situations without extra cost.

SUMMARY

The present invention achieves these and other objects by specially modifying a first LDPC code H matrix, referred to a "mother code," to become a smaller size LDPC code H matrix, referred to as a daughter code, and using the daughter code to encode and decode the information bits of transmitted and received digital signals. Another aspect of the invention employs code puncturing to improve code error correcting performance.

BRIEF DESCRIPTION OF THE DRAWINGS

FIGS. 3a, 3b, 4a, 4b, 5a and 5b are matrix diagrams that illustrate an LDPC H matrix as used by the encoder and decoder of FIGS. 1 and 2.

DETAILED DESCRIPTION

Figure 1:
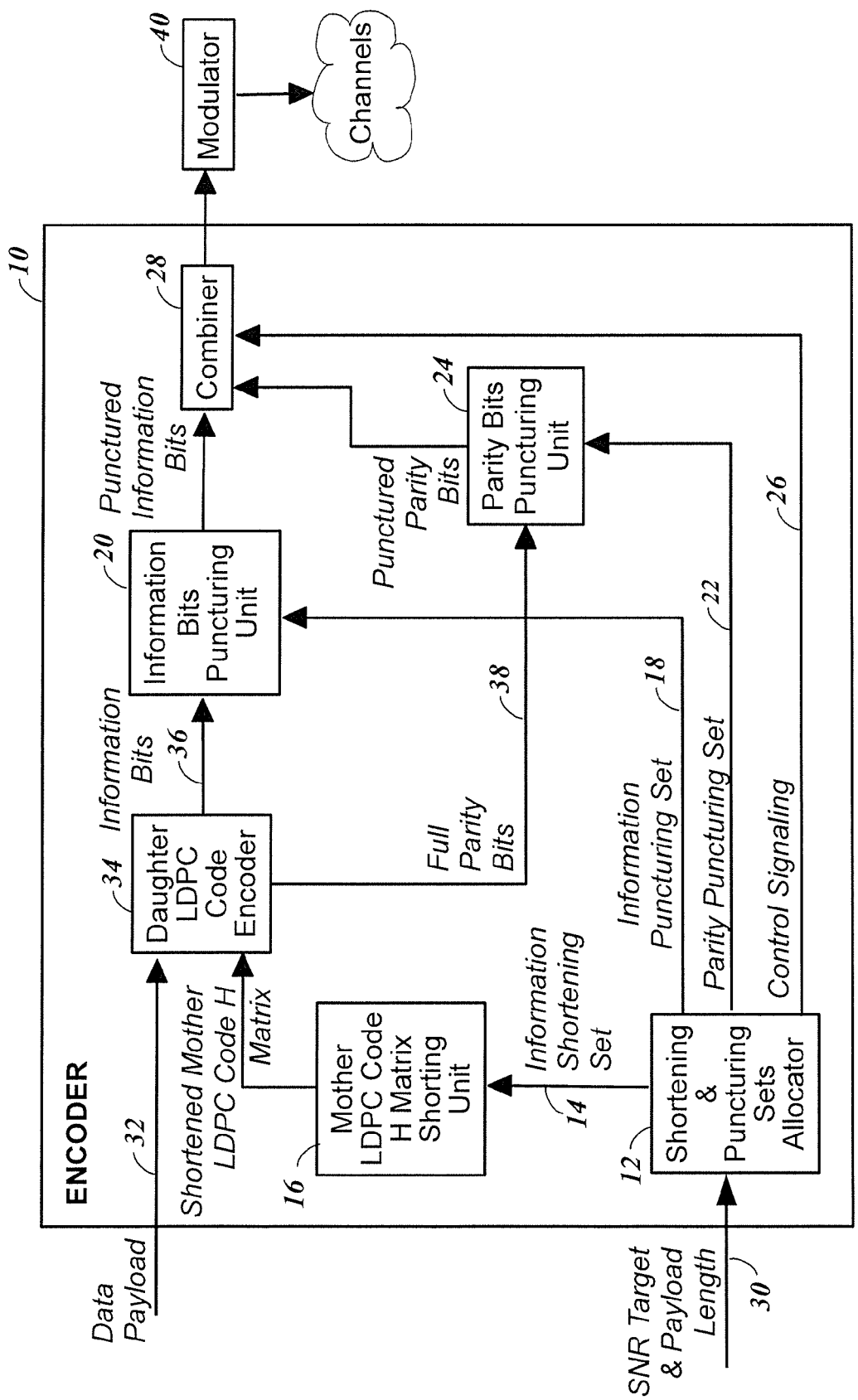
FIG. 1 is a block diagram showing an embodiment of an encoder according to the present invention.

FIG. 1 is a block diagram showing an embodiment of an encoder 10 according to a certain embodiment of the present invention. The encoder 10 may be provided in a transmitter of a digital communication system, for example. The encoder 10 comprises a shortening and puncturing sets allocator 12 which largely controls the operation of the encoder 10. The allocator 12 includes four outputs; a first output 14 connected to the input of a mother LDPC (low density parity check) code shortening unit 16, a second output 18 connected to an information bits puncturing unit 20, a third output 22 connected to a parity bits puncturing unit 24, and a fourth output 26 connected to a combiner 28. The allocator 12 also includes an input 30 for receiving a control signal reflecting a target SNR (signal to noise ratio) for the transmitted signal and the payload length of the transmitted information bits. The control signal on the control signal input 30 may be generated by another piece of equipment or may be manually inserted by the user on the encoder 10. The allocator 12, in response to the control signal supplied on the control signal input 30, derives and provides a first message on the first output 14 defining an information shortening set, a second message on the second output 18 defining an information puncturing set and a third message on the third output 22 defining a parity puncturing set. The allocator 12 also provides the control signal at the fourth output 26 for application to the combiner 28.

The purpose of the information shortening set provided on the output 14 of the allocator 12 is to shorten as necessary the mother LDPC H matrix stored in the code shortening unit 16 to match the length of the data payload supplied over an input 32 to a daughter LDPC code encoder 34. The information shortening set in certain embodiments identifies portions of the mother matrix to be removed to obtain the daughter matrix. Taking for example the simple case where the payload data is 800 bits and the mother LDPC code H matrix is 1000 bits, the information shortening set would instruct the shortening unit 16 to shorten the mother LDPC code H matrix by 200 bits and supply the resulting shortened daughter LDPC code H matrix for storage in the encoder 34. The daughter LDPC code matrix thus corresponds to the size of the data payload to be encoded and the daughter matrix may be used to encode the payload data for transmission in a digital communication system, for example.

More realistic parameters for the operation just described above are shown in FIGS. 3a and 3b. FIGS. 3a and 3b illustrate a practical mother LDPC code H matrix 80 comprising an information bits portion 82 and a parity bits portion 84. Each value in the information bits portion 82 of the chart 80 defines a unique smaller matrix of 1's and 0's characterized by a quasi-cyclic variation from one small matrix to the next. Each "0" value in the parity bits portion 84 of the chart 80 defines a smaller matrix of 1's and 0's characterized in that it consists of a single diagonal through the matrix. Although the H matrix 80 illustrated in FIGS. 3a and 3b is relatively complex, it is treated similar to the simple example given above. Thus, the mother LDPC code H matrix 80 illustrated in FIGS. 3a and 3b is shortened by reducing the number of bits comprising the matrix to match the number of bits in the data payload. Shortening is achieved in this example by dropping the bits in each column of the mother H matrix 80 identified by an "S" in the third row 86 of the matrix 80 (which corresponds to columns 2, 3, 7, 15, 21 and 27 in the illustrated example). The information shortening set on the output 14 as derived by the allocator 12, the first message, therefore comprises the set {2, 3, 7, 15, 21, 27}, which identifies the columns to be removed. The allocator 12 also supplies the control signal reflecting the information on the input 30 to the output 26 for application to the combiner 28 for transmission to the decoder, which will be described in more detail hereinafter.

The illustrated example shows removal of columns to achieve shortening of the mother matrix. It is possible that other portions of the matrix may be removed for shortening, such as rows, a combination of columns and rows, or other arrangements or patterns for shortening to form the daughter matrix.

The shortened daughter LDPC H matrix is supplied from the code shortening unit 16 to the encoder 34 where the shortened matrix is used to process the input data payload, for example to provide encoded data. Referring back to the simple example where both the data payload and shortened LDPC code H matrix are 800 bits, the encoder 34 will output 800 information bits on an output 36 and, for example, 1000 parity bits on an output 38. The parity bits on the output 38 are supplied to the input of the parity bits puncturing unit 24 and the information bits on the output 36 are supplied to the information bits puncturing unit 20.

Referring to FIGS. 4a and 4b, which illustrates the same mother LDPC code H matrix 80 as FIGS. 3a and 3b, in response to the second message comprising the information puncturing set {1, 4, 5}, identified by the letter "P" in row 88 at the top of the respective columns in the chart 80, on the output 18 of the allocator 12, the puncturing unit 20 will puncture the information bits supplied on the output 36 of the encoder 34 by dropping columns 1, 4, and 5 from the H matrix. In the case of the simple example, if 100 information bits are thus punctured from the 800 information bits provided, 700 punctured information bits are supplied from the information bits puncturing unit 20 to the combiner 28.

Figure 5B:
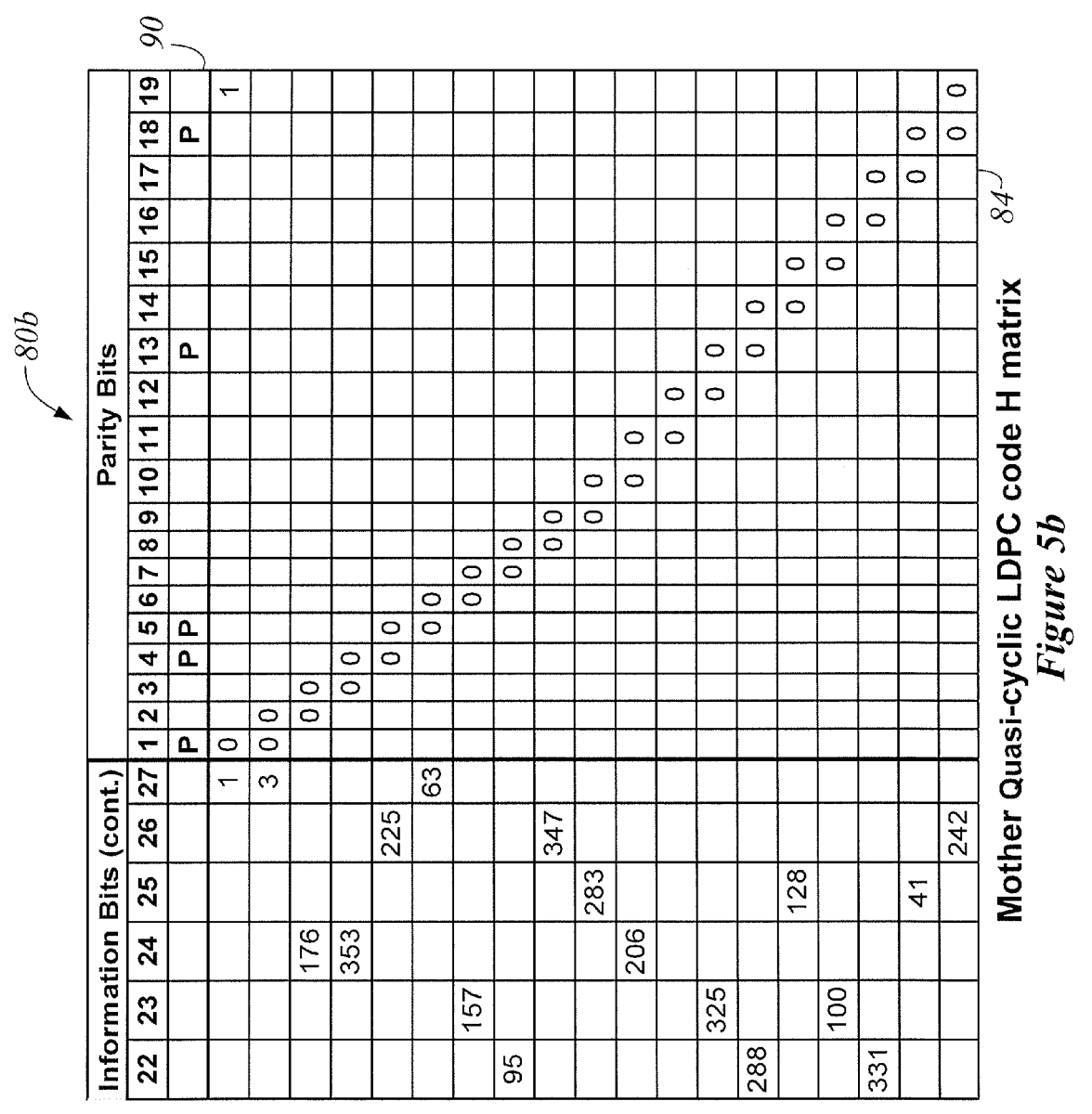

With reference now to FIGS. 5a and 5b, which also illustrates the same mother LDPC code H matrix 80 as shown in FIGS. 3a and 3b, in response to the third message comprising the parity puncturing set {1, 4, 5, 13, 18}, identified by the letter "P" in row 90 at the top of the respective columns in the parity portion of the chart 80, on the output 22 of the allocator 12, the puncturing unit 24 will puncture the parity bits supplied on the output 38 of the encoder 34 by dropping (or removing) columns 1, 4, 5, 13 and 18 from the H matrix. The person of skill in this art understands how to select portions of the matrix for puncturing. In the case of the simple example, if 1000 parity bits are supplied on the output 38 and 300 bits are punctured by the puncturing unit 24, 700 parity bits are supplied by the parity bits puncturing unit 24 to the combiner 28.

The illustrated example shows removal of columns to achieve puncturing of the matrix. It is possible that other portions of the matrix may be removed for puncturing, such as rows, combinations of rows and columns, or other arrangements or patterns for forming the punctured matrix.

Referring back to FIG. 1, the allocator 12 also supplies the control signal on the output 26, from which the first, second and third messages are derived, for application to the combiner 28. The combiner 28, which may comprise a conventional multiplexer, combines the (700) punctured information bits from the information bits puncturing unit 20, the (700) punctured parity bits from the parity bits puncturing unit 24 and the control signal from of the allocator 12. The combined signal is applied to a modulator 40 and other appropriate transmission equipment for transmission to the decoder, such as a decoder at a receiver, for example.

It should be noted that in operation the encoder has adapted itself to encode a shorter payload than the mother LDPC code H matrix is configured to handle and has punctured (performed a data puncturing process on) both the shortened information bits as well as the parity bits, thereby improving bandwidth efficiency and improving robustness of the transmitted signal.

Figure 2:
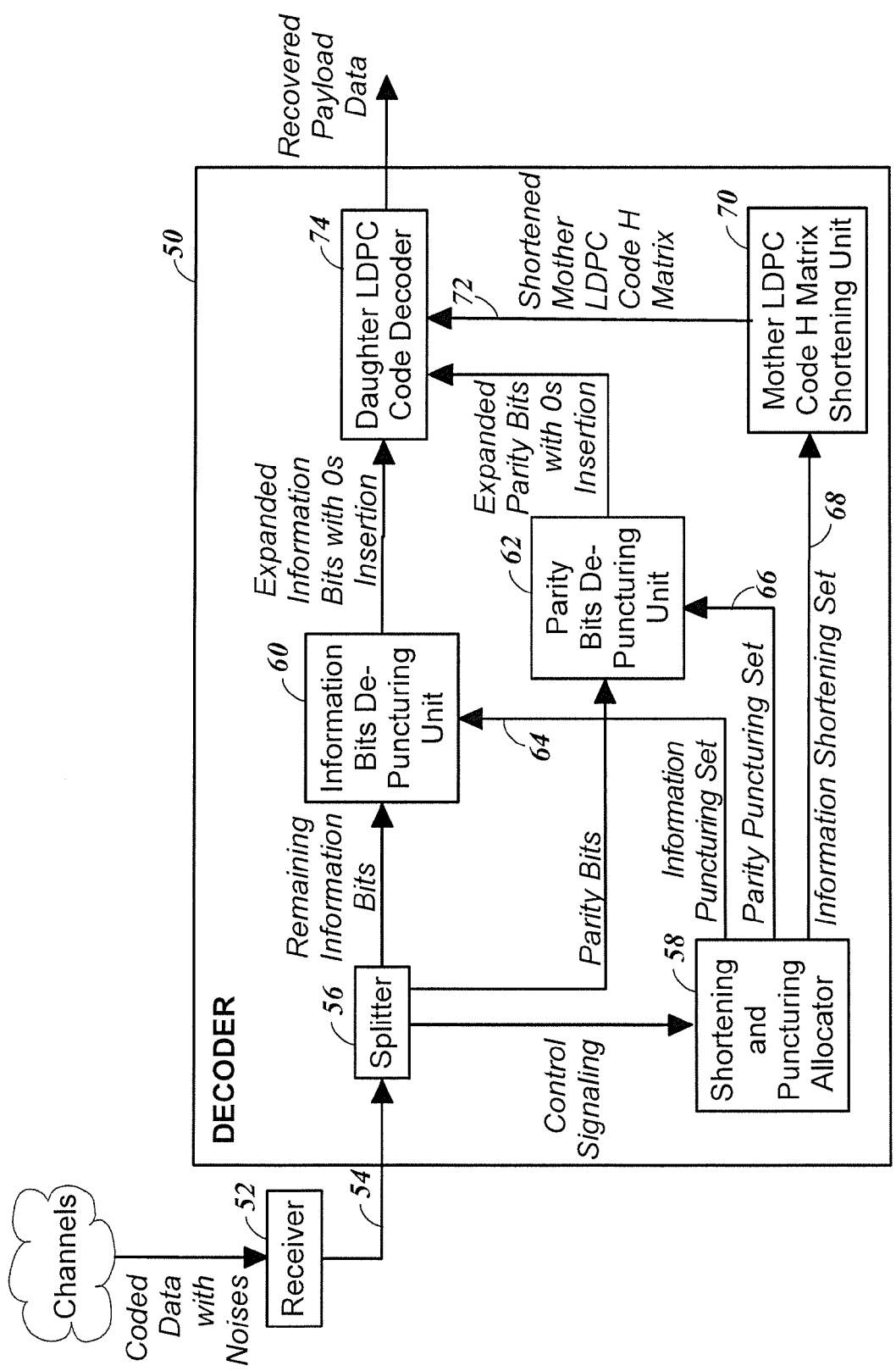
FIG. 2 is a block diagram showing an embodiment of a decoder according to the present invention.

FIG. 2 is a block diagram showing an embodiment of a decoder 50 according to the present invention. The decoder 50 may be provided in a receiver of a digital communication system, for example. The decoder 50, which may be implemented, for example, in the form of a field programmable gate array (FPGA), comprises a receiving unit 52 for receiving the signal transmitted from encoder 10. Other implementations are of course possible within the scope of the invention. The receiving unit 52 comprises a tuner, a demodulator and other receiving circuits for providing a digital signal on an output 54 representing the bits provided in the signal transmitted from the encoder 10. Continuing with the previously used example, 1400 bits are therefore supplied from the receiving unit 52 to a splitter 56 over the output 54.

It will be recalled that the transmitted signal included a control signal (representing a target SNR for the transmitted signal and the payload length of the transmitted information bits) from which the information shortening set (the first message), the information puncturing set (the second message) and the parity puncturing set (the third message) are obtained by an allocator. The splitter 56 extracts the control signal from the signal supplied on the output 54 and supplies it to a shortening and puncturing allocator 58. The splitter 56 also supplies a first portion of the bits on the output 54 containing the punctured information bits (700 bits in the example) to a first depuncturing unit 60 and supplies a second portion of the bits on the output 54 containing the parity bits (also 700 bits in the example) to a second depuncturing unit 62. The allocator 58 derives the information shortening set (the first message), the information puncturing set (the second message) and the parity puncturing set (the third message) from the received control signal and supplies them on outputs 68, 64 and 66, respectively. The allocator 58 is operationally identical to the allocator 12 at the encoder, so that the same information shortening set, information puncturing set and parity puncturing set are derived from the same control signal (that includes the SNR and payload length, in the illustrated example). The depuncturing units 60 and 62 are controlled by the second and third messages representing the information and parity puncturing sets supplied by the allocator 58 to the depuncturing units 60 and 62 on the respective outputs 64 and 66. The third message representing the information shortening set is supplied by the allocator 58 over the output 68 to a shortening LDPC mother code H matrix unit 70. The output of the shortening LDPC mother code H matrix unit 70 comprises a shortened H matrix supplied over a line 72 for storage in a memory of a daughter LDPC code decoder 74 which provides the recovered payload data on a decoder output 76. The mother code matrix is shortened to provide the smaller daughter code matrix, the daughter code matrix corresponding in size to the received data payload so that the data can be decoded using the daughter matrix.

It will be understood that much of the operation of the decoder 50 is reverse that of the operation of the encoder 10.

Thus, with reference again to the simplified example, 700 punctured bits of the received 1400 bits are depunctured by the first depuncturing unit 60 so that 800 expanded bits are provided thereby to the decoder 74. The depuncturing operation performed by the depuncturing unit 60 adds a number of 0's (100 in the case of the simplified example) in the correct locations as defined by the second message corresponding to the information puncturing set supplied on the output 64 of the allocator 58. A similar operation is performed by the depuncturing unit 62 which expands the 700 punctured parity bits supplied by the splitter 56 to 1000 expanded parity bits with 0's inserted in the correct locations as defined by the third message corresponding to the parity puncturing set supplied on the output 66 of the allocator 58.

The 800 expanded information bits and 1000 expanded parity bits are supplied by the depuncturing units 60 and 62 to the daughter LDPC code decoder 74. The decoder 74 comprises an H matrix corresponding in size to the supplied 800 expanded information bits (i.e. 800 bits) which is responsive to the expanded information bits together with the 1000 expanded parity bits to recover 800 error corrected payload data bits on the output 76. Advantageously, the H matrix used in the decoder 74 is derived from the H matrix stored in the shortening LDPC mother code H matrix unit 70. In particular, the H matrix stored in the matrix unit 70 is shortened by the matrix unit 70 in response to the first message corresponding to the information shortening set supplied on the output 68 of the allocator 58 from 1000 bits to 800 bits (matching the 800 expanded information bits in size) and supplied over the output 72 for storage in and use by the decoder 74.

Of course, both the encoder portion and the decoder portion may be shortened to accommodate data payloads of different sizes by shortening the mother code matrix as needed to provide daughter code matrices of corresponding sizes. In this way the operation of the decoder 50 is compatible with different length LDPC codes by appropriately varying the first message corresponding to the information shortening set supplied to the shortening LDPC mother code H matrix unit 70.

As in the case of the encoder 10, more realistic parameters for the operation of the decoder 50 are shown in FIGS. 3a-5b which were previously described in connection with the operation of the encoder and will therefore not be described in detail again. Thus, it will be recalled that FIGS. 3a and 3b illustrate a practical mother LDPC code H matrix 80 used by the matrix unit 70 to create the daughter LDPC code H matrix contained in the decoder 74, FIGS. 4a and 4b illustrate the use of the information puncturing set by the first depuncturing unit 60 to form the expanded information bits and FIGS. 5a and 5b illustrate the use of the parity puncturing set by the second depuncturing unit 62 to form the expanded parity bits.

Thus, there is shown and described a certain embodiment of a method and system for modifying the size of an encoding and decoding matrix to correspond to different sizes of data payloads. Other embodiments for modifying an encoding and/or decoding means and method to accommodate different sizes or characteristics of data payloads are within the scope of the present invention.

There is also shown and described a certain embodiment of a method and system for reducing data by puncturing both the information bits and the parity bits and for recovering the data by depuncturing the information bits and the parity bits. Other embodiments of a data reducing and data recovering means and method are within the scope of the present invention.

Although other modifications and changes may be suggested by those skilled in the art, it is the intention of the inventors to embody within the patent warranted hereon all changes and modifications as reasonably and properly come within the scope of their contribution to the art.

I claim:

1. A method of modifying a code matrix according to a received digital signal, comprising:
   storing a mother code matrix in a memory, the mother code matrix having a predetermined size;
   receiving a digital signal of a predetermined payload length;
   using an allocator to receive a control signal;
   using the allocator to derive an information modifying set from the control signal;
   modifying the stored mother code matrix in response to the information modifying set to produce a modified code matrix;
   storing the modified code matrix in a memory of a coder element, the coder element being one of an encoder or a decoder; and
   coding the received digital signal using the modified code matrix stored in the coder memory, the coding being one of encoding or decoding.

2. A method as claimed in claim 1, wherein the control signal includes payload length information of the digital signal.

3. A method as claimed in claim 1, wherein the information modifying set is an information shortening set, wherein the modified code matrix is of a smaller size than the mother code matrix, the information shortening set identifying portions of the mother code matrix to be removed to obtain the modified code matrix.

4. A method as claimed in claim 1, wherein the mother code matrix includes an LDPC code H-matrix.

5. A method as claimed in claim 1, wherein the control signal includes payload length information of the signal and channel condition target information, and
   wherein the information modifying set is derived from the payload length information and the channel condition target information.

6. A method as claimed in claim 5, wherein the channel condition target information includes signal to noise ratio target information; and
   wherein the information modifying set is derived from the payload length information and the signal to noise ratio target information.

7. A method of decoding a received digital signal encoded by a linear block code, comprising:
   storing a mother H-matrix defining the linear block code in a memory, the mother H-matrix having a predetermined size;
   receiving a control signal in an allocator, the control signal representing at least a payload length of the received digital signal;
   using the allocator to derive an information shortening set from the control signal;
   modifying the stored mother H-matrix in response to the information shortening set to produce a daughter H-matrix, the daughter H-matrix defining a linear block code smaller than the mother H-matrix;
   storing the daughter H-matrix in the memory of a linear block decoder; and
   decoding the received digital signal using the daughter H-matrix stored in the decoder memory.

8. The method of claim 7, wherein the linear block code comprises an LDPC code.

9. The method as claimed in claim 7, wherein the information shortening set identifies portions of the mother H-matrix to be removed, and
wherein the modifying the stored mother H-matrix includes removing portions of the mother H-matrix identified in the information shortening set to obtain the daughter H-matrix.

10. A method as claimed in claim 7, wherein the control signal includes channel condition target information; and
wherein the information shortening set is derived from the payload length information and the channel condition target information.

11. A method as claimed in claim 10, wherein the channel condition target information includes signal to noise ratio target information, and
wherein the information shortening set is derived from the payload length information and the signal to noise ratio target information.

12. A method of decoding a received digital signal encoded by a linear block code, comprising:
storing a mother H-matrix defining the linear block code in a memory, the mother H-matrix having a predetermined size;
receiving a control signal representing at least a payload length of the received digital signal;
deriving an information shortening set from the control signal;
modifying the stored mother H-matrix in response to the information shortening set to produce a daughter H-matrix, the daughter H-matrix defining a linear block code smaller than the mother H-matrix;
storing the daughter H-matrix in the memory of a linear block decoder;
decoding the received digital signal using the daughter H-matrix stored in the decoder memory;
wherein the information shortening set identifies portions of the mother H-matrix to be removed,
wherein the modifying the stored mother H-matrix includes removing portions of the mother H-matrix identified in the information shortening set to obtain the daughter H-matrix;
wherein the information shortening set identifies columns to be removed from the mother H-matrix; and
wherein the portions removed from the mother H-matrix include columns of the mother H-matrix as identified in the information shortening set.

13. A method for encoding a digital signal by a linear block code, comprising:
storing a mother H-matrix defining a linear block code in a memory, the mother H-matrix having a predetermined size;
receiving a digital signal to be encoded, the digital signal including a data payload;
using an allocator to receive a control signal including at least a payload length of the data payload to be encoded;
using the allocator to derive an information shortening set from the control signal;
modifying a mother H-matrix in response to the information shortening set to produce a daughter H-matrix, the daughter H-matrix defining a linear block code smaller than the mother H-matrix;
storing the daughter H-matrix in the memory of a linear block encoder; and
encoding the received digital signal using the daughter H-matrix stored in the linear block encoder memory.

14. The method of claim 13, wherein the linear block code comprises an LDPC code.

15. The method as claimed in claim 13, wherein the information shortening set identifies portions of the mother H-matrix to be removed, and
wherein the modifying the stored mother H-matrix includes removing portions of the mother H-matrix identified in the information shortening set to obtain the daughter H-matrix.

16. A method as claimed in claim 13, wherein the control signal includes channel condition target information; and
wherein the information shortening set is derived from the payload length information and the channel condition target information.

17. A method as claimed in claim 16, wherein the channel condition target information includes signal to noise ratio target information; and
wherein the information shortening set is derived from the payload length information and the signal to noise ratio target information.

18. A method for encoding a digital signal by a linear block code, comprising:
storing a mother H-matrix defining a linear block code in a memory, the mother H-matrix having a predetermined size;
receiving a digital signal to be encoded, the digital signal including a data payload;
receiving a control signal including at least a payload length of the data payload to be encoded;
deriving an information shortening set from the control signal;
modifying a mother H-matrix in response to the information shortening set to produce a daughter H-matrix, the daughter H-matrix defining a linear block code smaller than the mother H-matrix;
storing the daughter H-matrix in the memory of a linear block encoder;
encoding the received digital signal using the daughter H-matrix stored in the linear block encoder memory;
wherein the information shortening set identifies portions of the mother H-matrix to be removed;
wherein the modifying the stored mother H-matrix includes removing portions of the mother H-matrix identified in the information shortening set to obtain the daughter H-matrix;
wherein the information shortening set identifies columns to be removed from the mother H-matrix; and
wherein the portions removed from the mother H-matrix include columns of the mother H-matrix as identified in the information shortening set.

19. An apparatus for coding a digital signal, comprising:
an input for receiving the digital signal;
an input for receiving a control signal, the control signal including at least a payload length of the digital signal;
a memory for storing a mother H-matrix defining a linear block code of a predetermined size;
an allocator connected to receive the control signal and operable to generate an information shortening set;
a mother H-matrix shortening unit connected to receive the information shortening set and operable to modify the mother H-matrix according to the information shortening set to provide a daughter H-matrix; and
a daughter coding unit connected to receive and store the daughter H-matrix, the daughter coding unit being connected to receive the digital signal and being operable to code the digital signal using the daughter H-matrix stored in the daughter coding unit, the coding being one of encoding or decoding.

20. An apparatus as claimed in claim 19, wherein the mother H-matrix is an LDPC code matrix.

* * * * *